United States Patent [19]

Matsuzaki et al.

[11] Patent Number: 4,982,117
[45] Date of Patent: Jan. 1, 1991

[54] ADDRESS TRANSITION DETECTOR CIRCUIT

[75] Inventors: Yasurou Matsuzaki, Tami; Yuji Tsuchimoto; Yoshikazu Mutoh, both of Kawasaki; Masaki Takahashi, Mizusawa, all of Japan

[73] Assignee: Fujitsu Limited, Kawasaki, Japan

[21] Appl. No.: 433,912

[22] Filed: Nov. 9, 1989

[30] Foreign Application Priority Data

Nov. 10, 1988 [JP] Japan .................. 63-284272

[51] Int. Cl.⁵ .................. H03K 17/30; H03K 19/017
[52] U.S. Cl. .................. 307/480; 307/481; 307/446; 307/451; 307/452; 307/453; 307/291
[58] Field of Search ........ 307/480, 481, 446, 451–453, 307/291

[56] References Cited

U.S. PATENT DOCUMENTS 4,469,964  9/1984  Guttag et al. .................. 307/481
4,922,122  5/1990  Dubujet .................. 307/480

Primary Examiner—Stanley D. Miller
Assistant Examiner—A. Sanders
Attorney, Agent, or Firm—Staas & Halsey

[57] ABSTRACT

An address transition detector circuit detects a transition of an address signal. The address transition detector circuit has a first circuit part which includes two field effect transistors which are coupled in series and simultaneously turn ON when an address transition is detected, and a second circuit part which includes a bipolar transistor for discharging so that a transition detection signal changes its level immediately after the address transition is detected in the first circuit part.

18 Claims, 5 Drawing Sheets

FIG. 7
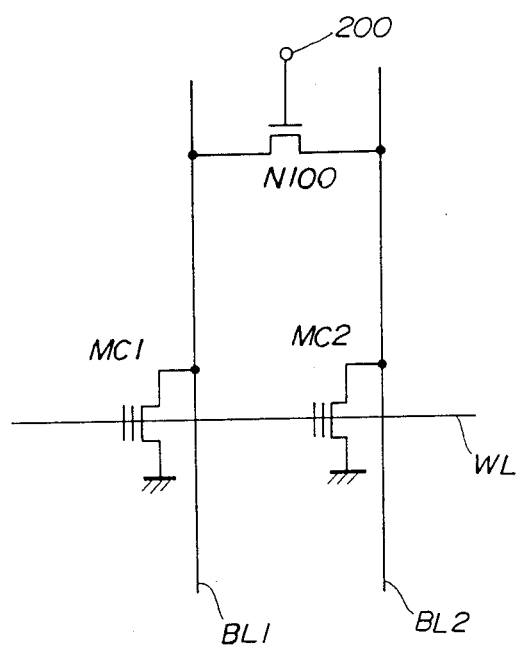
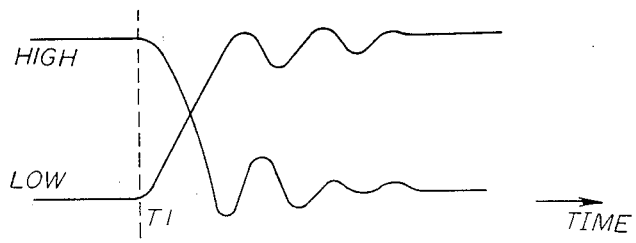
FIG. 8A
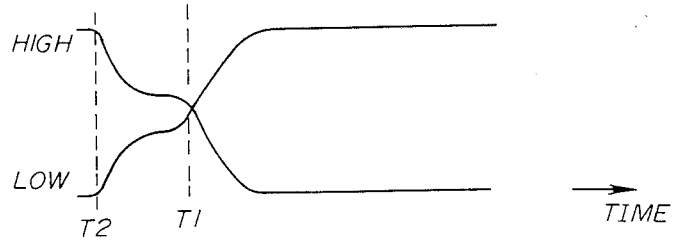
FIG. 8B

ADDRESS TRANSITION DETECTOR CIRCUIT

BACKGROUND OF THE INVENTION

The present invention generally relates to address transition detector circuits, and more particularly to an address transition detector circuit which detects a transition of an address signal and outputs a detection signal which is indicative of the address transition.

The address transition detector circuit detects a transition of an address which is supplied to a memory circuit and outputs a detection signal which is indicative of the address transition. This detection signal is used to set the level of bit lines or word lines to an intermediate level so that the level of the bit line or word line changes to a level which is in correspondence with a next address within a short time. Accordingly, it is important that the address transition detector circuit outputs the detection signal quickly when the address transition is detected.

FIG. 1 shows an example of a conventional address transition detector circuit. In FIG. 1, $\overline{A0}$ through $\overline{An}$ denote n+1 address signal bits which are respectively obtained by once inverting address signal bits A0 through An of the address signal, and A0 through An denote n+1 address signal bits which are respectively obtained by twice inverting the address signal bits A0 through An of the address signal. The address signal bits $\overline{Ai}$ and Ai are supplied to a corresponding detection circuit $1_i$, where i=0, 1, ..., n.

Because the circuit constructions of the detection circuits $1_0$ through $1_n$ are the same, a description will only be given of the circuit construction and operation of the detection circuit $1_0$. The detection circuit $1_0$ comprises NAND circuits 2 and 3, loads Z1 and Z2, and n-channel metal oxide semiconductor field effect transistors (MOSFETs) Tr1 and Tr2 which are connected as shown.

When the address signal bit $\overline{A0}$ has a high level and the address signal bit A0 has a low level, the NAND circuit 3 outputs a high-level signal and the two input signals to the NAND circuit 2 both have high levels. Hence, the NAND circuit 2 outputs a low-level signal. The output signals of the NAND circuits 2 and 3 are respectively applied to the transistors Tr1 and Tr2, and thus, the transistor Tr1 turns OFF and the transistor Tr2 turns ON.

When the address signal bit $\overline{A0}$ changes to a low level and the address signal bit A0 changes to a high level, a first input signal to the NAND circuit 2, that is, the address signal bit $\overline{A0}$, has the low level. For this reason, the output signal level of the NAND circuit 2 immediately becomes high regardless of a second input signal to the NAND circuit 2, that is, independently of the output signal of the NAND circuit 3. On the other hand, a first input signal to the NAND circuit 3 has a high level because it is the address signal bit A0. Hence, the output signal level of the NAND circuit 3 is determined by a second input signal thereto, that is, the level of the output signal of the NAND circuit 2 which is supplied to the NAND circuit 3. As mentioned above, the output signal of the NAND circuit 2 immediately changes from the low level to the high level, but the output signal of the NAND circuit 2 is supplied to the NAND circuit 3 via the load Z1. As a result, the second input signal to the NAND circuit 3 gradually rises from the low level to the high level with a time constant which is determined by the load Z1 and a stray capacitance of an input terminal of the NAND circuit 3 which receives the second input signal.

Therefore, the output signal of the NAND circuit 3 remains at the high level for a predetermined time starting from a time when the output signal of the NAND circuit 2 changes to the high level until a time when a threshold value of the NAND circuit 3 is exceeded. The output signal of the NAND circuit 3 changes to the low level only after the predetermined time elapses.

During the above mentioned predetermined time, the transistors Tr1 and Tr2 are both ON and a current flows in a current path which is made up of a pull-up load Z5, the transistor Tr1 and the transistor Tr2. Consequently, the potential becomes a low level at a common node NP which connects the load Z5, a drain of the transistor Tr1 and an input terminal of an inverter 5.

After the predetermined time elapses, the transistor Tr1 remains in the ON state but the transistor Tr2 changes from the ON state to the OFF state. Thus, the aforementioned current no longer flows in the current path and the potential at the common node NP becomes the high level similarly to the case where the address signal bit $\overline{A0}$ has the high level and the address signal bit A0 has the low level. Accordingly, a transition detection signal which is obtained from the inverter 5 is a positive polarity pulse which has a high level for a predetermined time when the address signal bit A0 ($\overline{A0}$, A0) undergoes a transition.

The other detection circuits $1_1$ through $1_n$ operate similarly to the detection circuit $1_0$. Therefore, when at least one of the address signal bits A0 through An undergoes a transition, the positive polarity pulse which has the high level for the predetermined time is output from the inverter 5 as the transition detection signal.

However, according to the conventional address transition detector circuit, the n+1 detection circuits $1_0$ through $1_n$ are coupled in parallel and the outputs of these detection circuits $1_0$ through $1_n$ are coupled in common to the load Z5. For this reason, there is a large stray capacitance in an interconnection L between the load Z5 and the outputs of the detection circuits $1_0$ through $1_n$. Because of this large stray capacitance of the interconnection L, the potential at the common node NP cannot undergo a rapid change and can only change with a certain inclination, thereby introducing a delay when the potential at the common node NP falls. The conventional address transition detector circuit thus suffers a problem in that the rise of the transition detection signal output from the inverter 5 is slow, that is, the transition detection timing is slow.

On the other hand, it is possible to make the potential change at the common node NP quick by increasing the size of the transistors Tr1 and Tr2. But in this case, it is necessary to also make the size of the circuit which drives the transistors Tr1 and Tr2 large. As a result, the conventional address transition detector circuit becomes bulky due to the large transistors Tr1 and Tr2 and the large driving circuit which occupy a large space.

SUMMARY OF THE INVENTION

Accordingly, it is a general object of the present invention to provide a novel and useful address transition detector circuit in which the problems described above are eliminated.

Another and more specific object of the present invention is to provide an address transition detector circuit for detecting a transition of an address signal and for outputting a transition detection signal, comprising a first gate circuit having first and second input terminals for receiving a first address signal at the first input terminal, a second gate circuit having third and fourth input terminals for receiving a second address signal at the third input terminal, where the first and second address signals are derived from the same address signal but have mutually different phases, a first load for feeding back an output signal of the first gate circuit to the fourth input terminal, a second load for feeding back an output signal of the second gate circuit to the second input terminal, a third gate circuit supplied with the output signals of the first and second gate circuits and comprising first and second field effect transistors which are connected in series between first and second nodes, where the output signal of the first gate circuit is supplied to a gate of the first field effect transistor and the output signal of the second gate circuit is supplied to a gate of the second field effect transistor so that the first and second field effect transistors are simultaneously turned ON for a predetermined time when the first and second address signals undergo a transition, first and second power sources respectively for generating first and second power source voltages, and means coupled to the first and second nodes and to the first and second power sources for pulling a potential at the first node towards the second power source voltage to a first logic level when both the first and second field effect transistors are turned ON and for pulling the potential at the first node towards the first power source voltage to a second logic level when one of the first and second field effect transistors thereafter turn OFF. The means includes a bipolar transistor for pulling the potential at the first node towards the second power source voltage when the bipolar transistor is ON and a third load for discharging a base charge of the bipolar transistor towards the first or second power source voltage when the bipolar transistor is OFF, and a transition detection signal indicative of the transition of the first and second address signals is obtained from the bipolar transistor. According to the address transition detector circuit of the present invention, it is possible to obtain a transition detection signal immediately when the address transition is detected. Further, there is no need to use field effect transistors having a large size.

Still another object of the present invention is to provide an address transition detector circuit for detecting a transition of an address signal and for outputting a transition detection signal, comprising a plurality of detection circuits each supplied with two address signal bits which are both derived from the same bit of the address signal but have mutually different phases, first and second power sources respectively for generating first and second power source voltages, a first node which connects outputs of the detection circuits, and a first load which is connected between the first power source and the first node. An arbitrary one of the detection circuits comprises a first gate circuit having first and second input terminals for receiving a first address signal bit at the first input terminal, a second gate circuit having third and fourth input terminals for receiving a second address signal bit at the third input terminal, where the first and second address signal bits are derived from the same address signal bit but having mutually different phases, a second load for feeding back an output signal of the first gate circuit to the fourth input terminal, a third load for feeding back an output signal of the second gate circuit to the second input terminal, a third gate circuit supplied with the output signals of the first and second gate circuits, where the third gate circuit comprises first and second field effect transistors which are connected in series between second and third nodes, where the output signal of the first gate circuit is supplied to a gate of the first field effect transistor and the output signal of the second gate circuit is supplied to a gate of the second field effect transistor so that the first and second field effect transistors are simultaneously turned ON for a predetermined time when the first and second address signals undergo a transition, and means coupled to the first and second nodes and to the first and second power sources for pulling a potential at the second node towards the second power source voltage to a first logic level when both the first and second field effect transistors are turned ON and for pulling the potential at the second node towards the first power source voltage to a second logic level when one of the first and second field effect transistors thereafter turn OFF. The means includes a bipolar transistor for pulling the potential at the second node towards the second power source voltage when the bipolar transistor is ON and a fourth load for discharging a base charge of the bipolar transistor towards the first or second power source voltage when the bipolar transistor is OFF. A detection signal indicative of a transition in the first and second address signal bits is obtained from the bipolar transistor and supplied to the first node, and a transition detection signal indicative of a transition in at least one of the address signal bits is obtained from the first node. According to the address transition detector circuit of the present invention, it is possible to obtain a transition detection signal immediately when the address transition is detected.

Other objects and further features of the present invention will be apparent from the following detailed description when read in conjunction with the accompanying drawings.

BRIEF DESCRIPTION OF THE DRAWINGS

FIG. 7 is a circuit diagram showing an essential part of another memory device to which the present invention may be applied;

FIGS. 8A and 8B respectively are waveforms for explaining an application of the present invention to an output circuit of a memory device.

DESCRIPTION OF THE PREFERRED EMBODIMENTS

Figure 2:
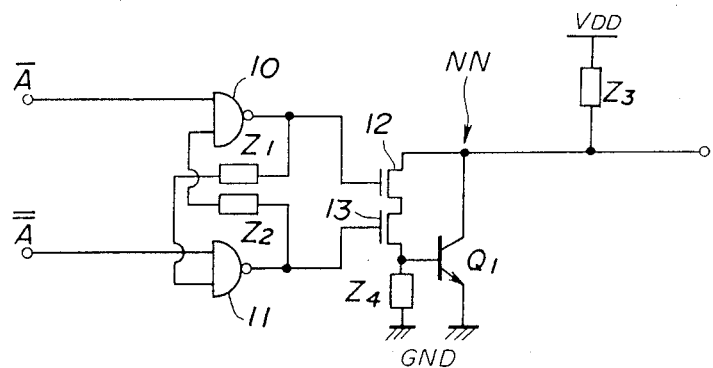
FIG. 2 is a circuit diagram showing an essential part of a first embodiment of an address transition detector circuit according to the present invention.

FIG. 2 shows an essential part of a first embodiment of an address transition detector circuit according to the present invention. In FIG. 2, an address signal $\overline{A}$ is obtained by once inverting an address signal A the transition of which is to be detected, and an address signal A is obtained by twice inverting the address signal A. The address signal A has the same phase as the address signal A. The address signal $\overline{A}$ is supplied to a first input terminal of a first gate circuit 10, and the address signal A is supplied to a first input terminal of a second gate circuit 11. In this embodiment, the first and second gate circuits 10 and 11 are NAND circuits.

Field effect transistors (FETs) 12 and 13 are respectively connected to output terminals of the first and second gate circuits 10 and 11. The FETs 12 and 13 are also connected to each other in series. The output terminal of the first gate circuit 10 is also coupled to a second input terminal of the second gate circuit 11 via a load Z1. The output terminal of the second gate circuit 11 is coupled to a second input terminal of the first gate circuit 10 via a load Z2.

A drain or a source of the FET 12 not connected to the FET 13 is coupled to a first power source $V_{DD}$ which generates a first power source volta $V_{DD}$ via a load Z3. A drain or a source of the FET 13 not connected to the FET 12 is coupled to a second power source GND which generates a second power source voltage GND via a load Z4. A bipolar transistor Q1 constitutes an essential part of this embodiment. A base and an emitter of the bipolar transistor Q1 is coupled to both ends of the load Z4. A collector of the bipolar transistor Q1 is connected to a node NN which connects the load Z3 and the FET 12.

When the first power source voltage $V_{DD}$ is a high D.C. voltage compared to the second power source voltage GND, the first and second gate circuits 10 and 11 are constituted by NAND gates, the FETs 12 and 13 are constituted by n-channel FETs, and the bipolar transistor Q1 is constituted by an NPN type bipolar transistor.

However, when the first power source voltage $V_{DD}$ is a low D.C. voltage compared to the second power source voltage GND, the logic is inverted to the above. In other words, the first and second gate circuits 10 and 11 are constituted by AND gates, the FETs 12 and 13 are constituted by p-channel FETs, and the bipolar transistor Q1 is constituted by a PNP type bipolar transistor.

Figure 1:
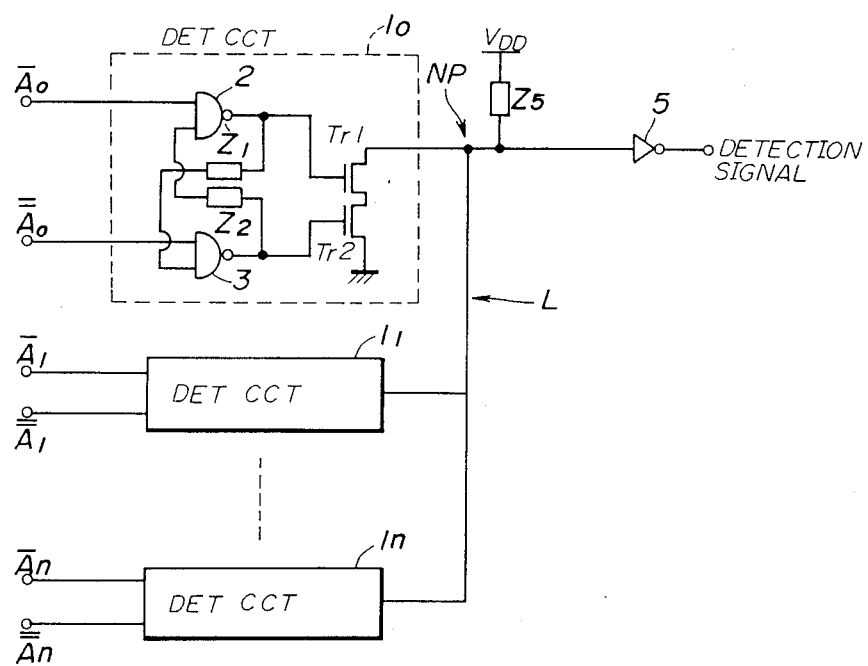
FIG. 1 is a circuit diagram showing an example of a conventional address transition detector circuit.

In FIG. 2, a circuit part which is made up of the first and second gate circuits 10 and 11, the loads Z1 and Z2 and the FETs 12 and 13 is basically the same as the detection circuit $1_0$ of the conventional address transition detector circuit described before in conjunction with FIG. 1, and operates similarly to the detection circuit $1_0$. Accordingly, when the levels of the address signals $\overline{A}$ and A change, the transistors 12 and 13 simultaneously turn ON for a predetermined time.

When the transistors 12 and 13 turn ON, a base current flows to a base of the bipolar transistor Q1 through the load Z3 and the transistors 12 and 13 and the bipolar transistor Q1 turns ON. When the bipolar transistor Q1 turns ON, the potential falls to the low level at a node NN which connects the transistors 12 and Q and the load Z3.

As is well known, the driving capacity of the bipolar transistor Q1 is greater than that of a MOS FET. Hence, the bipolar transistor Q1 can discharge the charge which is charged in the load capacitance at a high speed. This means that the potential at the node NN falls sharply when compared to the conventional case, without the need to increase the size of the transistors 12 and 13.

When the aforementioned predetermined time elapses, one of the transistors 12 and 13 turns OFF, and a current no longer flows to the base of the bipolar transistor Q1 thereby turning the bipolar transistor Q1 OFF. As a result, the potential at the node NN gradually rises towards the first power source voltage $V_{DD}$. In addition, in order to completely turn OFF the bipolar transistor Q1, the charge at the base of the bipolar transistor Q1 is discharged through the load Z4.

Therefore, it is possible to obtain from the node NN a transition detection signal which sharply rises immediately after the address transition is detected.

Figure 3:
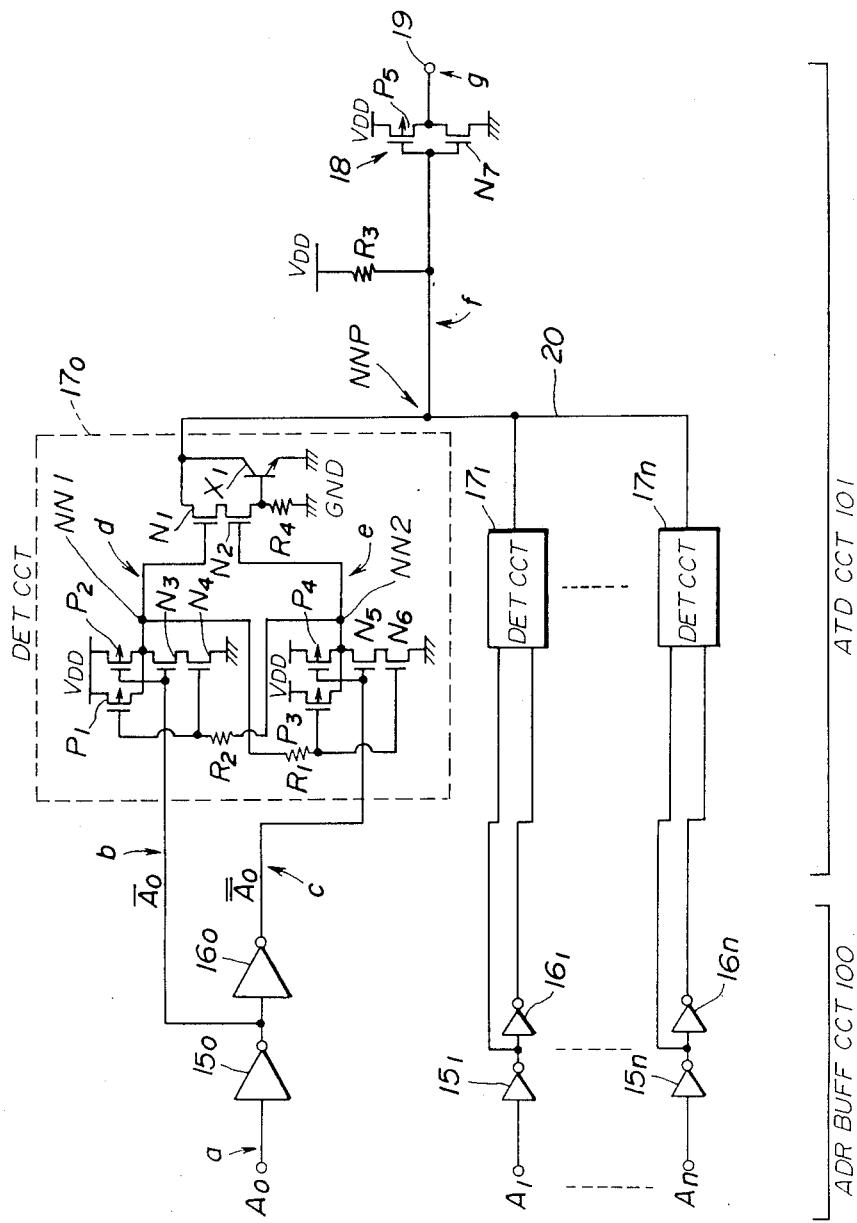
FIG. 3 is a circuit diagram showing a second embodiment of the address transition detector circuit according to the present invention.

FIG. 3 shows a second embodiment of the address transition detector circuit according to the present invention. In FIG. 3, an address buffer circuit 100 is provided in a stage preceding an address transition detector circuit 101. The address buffer circuit 100 comprises two stages of inverters, namely, inverters $15_0$ through $15_n$ and inverters $16_0$ through $16_n$ which are respectively provided in correspondence with n+1 address signal bits A0 through An. An inverter $15_i$ receives an address signal bit Ai and outputs an address signal bit Ai and an inverter $16_i$ receives the address signal bit Ai and outputs an address signal bit Ai, where i=0, 1, ..., n.

The address transition detector circuit 101 comprises detection circuits $17_0$ through $17_n$, a resistor R3, and a complementary metal oxide semiconductor (CMOS) inverter 18. Because the circuit constructions of the detection circuits $17_0$ through $17_n$ are the same, a description will only be given of the circuit construction and operation of the detection circuit $17_0$. The detection circuit $17_0$ comprises p-channel MOS FETs P1 through P4, n-channel MOS FETs N1 through N6, resistors R1, R2 and R4, and an NPN type transistor X1 which are connected as shown. The p-channel MOS FETs P1 and P2 and the n-channel MOS FETs N3 and N4 constitute a first 2-input NAND circuit which corresponds to the first gate circuit 10 shown in FIG. 2. The p-channel MOS FETs P3 and P4 and the n-channel MOS FETs N5 and N6 constitute a second 2-input NAND circuit which corresponds to the second gate circuit 11 shown in FIG. 2.

A common node NN1 which connects the MOS FETs P1, P2 and N3 is connected to a gate of the MOS FET N1. On the other hand, a common node NN2 which connects the MOS FETs P3, P4 and N5 is connected to a gate of the MOS FET N2. The MOS FETs N1 and N2 are connected in series to form a series connection and one end of the series connection is coupled to the first power source $V_{DD}$ via the resistor R3. The other end of the series connection is coupled to the second power source GND through the resistor R4. In this embodiment, this other end of the series connection is grounded through the resistor R4. The npn type transistor X1 corresponds to the bipolar transistor Q1 shown in FIG. 2. A base and an emitter of the npn type transistor X1 are respectively connected to opposite ends of the resistor R4, while a collector of the npn type transistor X1 is connected to the resistor R3.

Output terminals of the detection circuits $17_0$ through $17_n$ are connected in common to the single resistor R3 via a common node NNP. This common node NNP is coupled to an output terminal 19 via the CMOS inverter 18. The CMOS inverter 18 comprises a p-channel MOS FET P5 and an n-channel MOS FET N7.

Next, a description will be given of the operation of the second embodiment, by referring to a time chart shown in FIGS. 4(A) through 4(G). When it is assumed for the sake of convenience that the address signal bit A0 has the high level, the address signal bit $\overline{A0}$ has the low level and the address signal bit A0 has the high level. Accordingly, the address signal bit $\overline{A0}$ is applied to gates of the MOS FETs P2 and N3, and the MOS FET P2 turns ON and the MOS FET N3 turns OFF. Thus, a high-level signal is applied to a gate of the MOS FET N1 through the MOS FET P2 and the MOS FET N1 turns ON.

On the other hand, the address signal bit A0 is applied to gates of the MOS FETs P4 and N5, and the MOS FET P4 turns OFF and the MOS FET N5 turns ON. In addition, the high-level signal at the node NN1 is applied to gates of the MOS FETs P3 and N6 through the resistor R1, and the MOS FET P3 turns OFF and the MOS FET N6 turns ON. Accordingly, a low-level signal is applied to a gate of the MOS FET N2 and the MOS FET N2 turns OFF.

For this reason, no base current flows to the npn type transistor X1 and the npn type transistor X2 turns OFF. The potential at the common node NNP is the high level, and a low-level signal is output from the output terminal 19.

Figure 4:
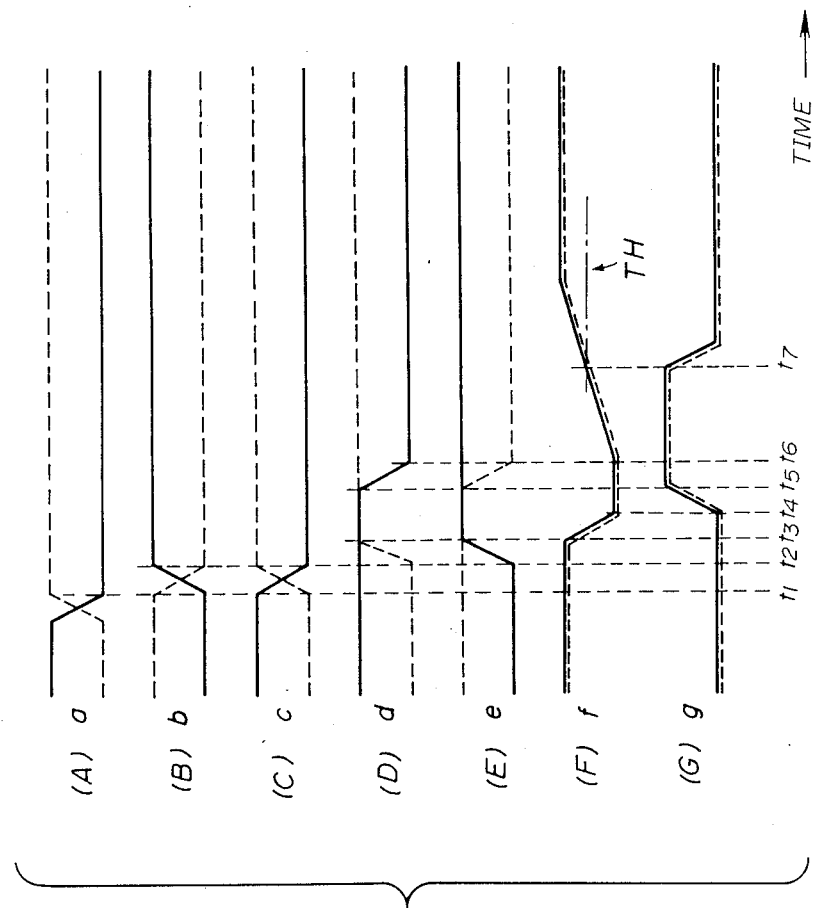
FIG. 4 is a time chart for explaining an operation of the second embodiment.

In this state, it is assumed for the sake of convenience that the address signal bit A0 changes from the high level to the low level at a time t1 as indicated by a solid line a in FIG. 4(A). In this case, the address signal bit $\overline{A0}$ changes from the low level to the high level at a time t2 as indicated by a solid line b in FIG. 4(B), and the address signal bit A0 changes from the high level to the low level at a time t2 as indicated by a solid line c in FIG. 4(C). When the address signal bit A0 has the low level, the MOS FET P4 turns ON and the MOS FET N5 turns OFF. Hence, a signal obtained at the node NN2 changes to the high level at a time t3 which is immediately after the time t2 as indicated by a solid line e in FIG. 4(E). Thus, the MOS FET N2 turns ON.

On the other hand, when the address signal bit $\overline{A0}$ changes to the high level, the MOS FET P2 turns OFF and the MOS FET N3 turns ON. But the gate potentials of the MOS FETs P1 and N4 which receive the high-level signal from the node NN2 through the resistor R2 gradually rise with a time constant which is determined by the resistance of the resistor R2 and the gate capacitances of the MOS FETs P1 and N4. Hence, the MOS FET P1 remains ON and the MOS FET N4 remains OFF until a time t5 which is a predetermined time from the time t3. The MOS FET P1 turns OFF and the MOS FET N4 turns ON only after the time t5. Therefore, a signal which is obtained at the node NN1 maintains the high level to the time t5 and changes to the low level after the time t5 as indicated by a solid line d in FIG. 4(D).

During the predetermined time from the time t3 to the time t5, the MOS FETs N1 and N2 simultaneously turn ON and a current flows to the base of the npn type transistor X1 through a current path which includes the resistor R3 and the MOS FETs N1 and N2. Accordingly, a collector potential of the npn type transistor X1, that is, the potential at the common node NNP, changes to the low level at a time t4 which is immediately after the time t3 as indicated by a solid line f in FIG. 4(F).

Because the npn type transistor X1 is a bipolar transistor, the charge which is charged in the load capacitance (stray capacitance of a connection line 20 which connects each output terminal of the detection circuits $17_0$ through $17_n$ to the resistor R3). As a result, the fall of the signal at the common node NNP from the time t3 to the time t4 is considerably sharp compared to that of the conventional circuit.

Therefore, the output signal of the CMOS inverter 18 which inverts the signal at the common node NNP rises from the time t4 as indicated by a solid line g in FIG. 4(G). This output signal of the CMOS inverter 18 is output via the output terminal 19 as the transition detection signal. According to this embodiment, the rise of the transition detection signal output from the output terminal 19 is quick compared to that of the conventional circuit.

When the MOS FET P1 turns OFF and the MOS FET N4 turns ON after the time t5, the signal at the node NN1 which is applied to the gate of the MOS FET N1 changes to the low level as indicated by the solid line d in FIG. 4(D). Consequently, the MOS FET N1 turns OFF and the npn type transistor X1 turns OFF.

During the time in which the npn type transistor X1 is ON, the charging takes place by the base capacitance of the npn type transistor X1. Hence, in order to completely turn OFF the npn type transistor X1 and set the collector potential thereof to a predetermined potential, the charge at the base of the npn type transistor X1 is discharged through the resistor R4.

When the npn type transistor X1 turns OFF at a time t6, the collector potential of the npn type transistor X1 gradually rises towards the first power source voltage $V_{DD}$ as indicated by the solid line f in FIG. 4(F). The inclination of this rise in the collector potential is dependent on a time constant which is determined by a product of the stray capacitance of the connection line 20 and the resistance of the resistor R3. In this embodiment, this time constant is set to a large value so that the inclination of the rise in the collector potential is gradual.

When the collector potential of the npn type transistor X1 further rises and exceeds a threshold value TH of the CMOS inverter 18 at a time t7 as indicated by the solid line f in FIG. 4(F), the transition detection signal which is output from the CMOS inverter 18 to the output terminal 19 changes to the low level immediately after the time t7 as indicated by the solid line g in FIG. 4(G).

Accordingly, when the address signal bit A0 changes from the high level to the low level, a positive polarity pulse is output from the output terminal 19 as the transition detection signal as indicated by the solid line g in FIG. 4(G). In addition, this positive polarity pulse has a pulse width which may be adjusted by the resistance of the resistor R3 so as to adjust the inclination of the rise in the collector potential of the npn type transistor X1.

When the address signal bit A0 changes from the low level to the high level as indicated by a phantom line in FIG. 4(A), the other signals change as indicated by phantom lines in FIGS. 4(B) through 4(G). In this case, after the MOS FETs N1 and N2 simultaneously turn ON for a predetermined time, the transistor N2 turns OFF. Hence, the npn type transistor X1 turns OFF similarly to the case described above. Accordingly, the collector potential of the npn type transistor X1 and the transition detection signal respectively become as indicated by the phantom lines in FIGS. 4(F) and 4(G). A positive polarity pulse is also output as the transition detection signal in this case.

In both cases where the address signal bit A0 changes from the high level to the low level and the address signal bit A0 changes from the low level to the high level, the transition detection signal which is output from the output terminal 19 is a positive polarity pulse which rises within an extremely short time from the time when the address transition is detected.

The other detection circuits $17_1$ through $17_n$ operate similarly to the detection circuit $17_0$. Hence, the transition detection signal (positive polarity pulse) is output from the output terminal 19 when at least one of the address signal bits A0 through An undergo a transition.

Figure 5:
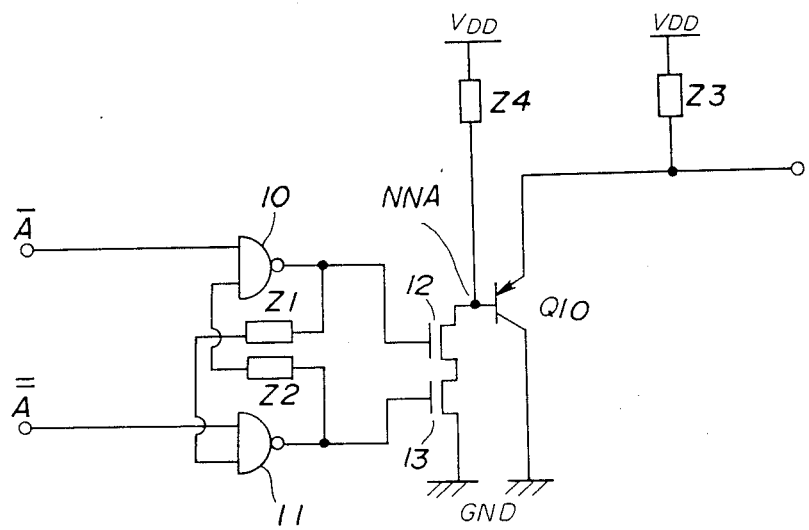
FIG. 5 is a circuit diagram showing an essential part of a third embodiment of the address transition detector circuit according to the present invention.

Next, a description will be given of a third embodiment of the address transition detector circuit according to the present invention, by referring to FIG. 5. In FIG. 5, those parts which are essentially the same as those corresponding parts in FIG. 2 are designated by the same reference numerals, and a description thereof will be omitted. In this embodiment, a pnp type bipolar transistor Q10 is provided in place of the npn type bipolar transistor Q1 shown in FIG. 2. Furthermore, the FETs 12 and 13 are connected in series between a node NNA and the second power source GND, and the load Z4 is connected between the node NNA and the first power source $V_{DD}$. The node NNA connects the load Z4, the FET 12 and the pnp type transistor Q10. The load Z3 is connected between the first power source $V_{DD}$ and an emitter of the pnp type transistor Q10. A collector of the pnp type transistor Q10 is connected to the second power source GND.

The effects obtainable in this embodiment are the same as those obtainable in the first embodiment. Hence, the circuit shown in FIG. 5 may be arranged similarly to the arrangement shown in FIG. 3, that is, a plurality of circuits having the circuit construction shown in FIG. 5 may be arranged in parallel in correspondence with the number of address signal bits. In this case, only the internal circuit construction of the detection circuits $17_0$ through $17_n$ becomes different from that shown in FIG. 3.

Figure 6:
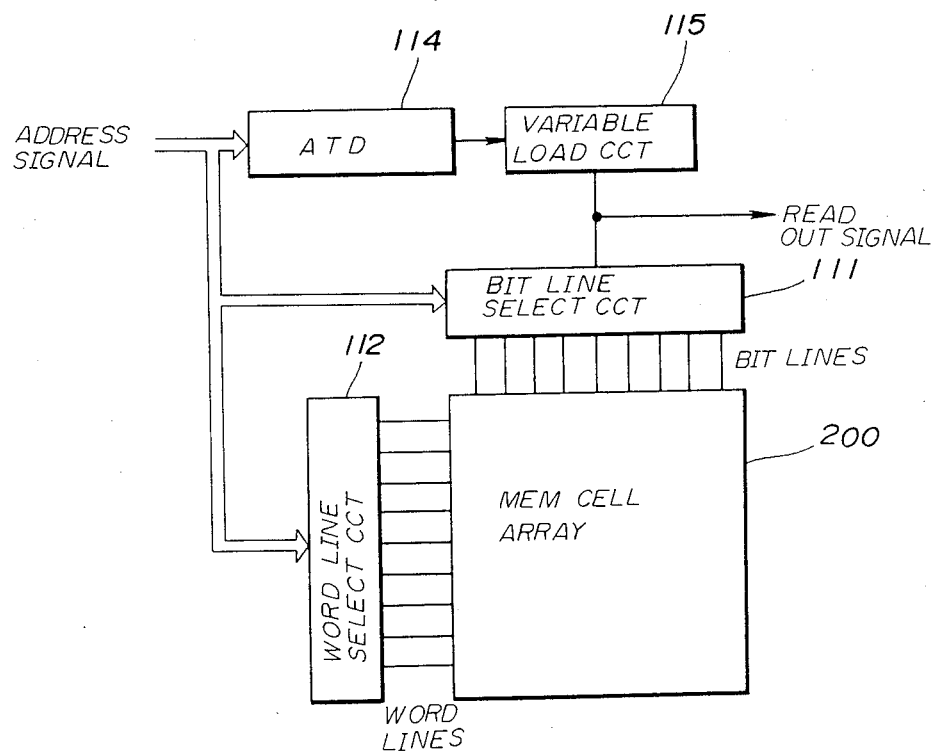
FIG. 6 is a system block diagram generally showing a memory device to which the present invention may be applied.

FIG. 6 generally shows a memory device to which the address transition detector circuit according to the present invention may be applied. In FIG. 6, a programmable read only memory (PROM) has a BiCMOS structure and generally comprises a memory cell array 200, a bit line selection circuit 111, a word line selection circuit 112, an address transition detector circuit 114 and a variable load circuit 115. The bit line selection circuit 111 selects a bit line responsive to the address signal, and the word line selection circuit 112 selects a word line responsive to the address signal. The address transition detector circuit 114 detects a transition of the address signal, that is, an address transition. The variable load circuit 115 is connected to a plurality of bit lines of the memory cell array 200 and a load of the variable load circuit 115 changes depending on an output detection signal of the address transition detector 114. A junction of a memory cell within the memory cell array 200 is destroyed and short-circuited when data is written into this memory cell.

When an address transition occurs, the address transition detector circuit 114 outputs a transition detection signal and the load of the variable load circuit 115 is set to a small value thereby. Hence, a bit line current which is supplied to the selected bit line becomes large. Accordingly, the bit line voltage can be raised at a high speed especially when the selected cell is switched from a written cell to a non-written cell, and it is thus possible to realize an extremely short access time, that is, to realize a high-speed operation. In a steady state where no address transition takes place, the address transition detector circuit 114 does not output the transition detection signal and the load of the variable load circuit 115 is set to a large value. Thus, the bit line current which is supplied to the selected bit line becomes small. Accordingly, it is possible to realize a low power consumption, a high reliability because there is no possibility of the grow back phenomenon occurring. Furthermore, it is only necessary to provide a single variable load circuit 115 with respect to the plurality of bit lines and the provision of the variable load circuit 115 does not deteriorate the integration density of the PROM.

FIG. 7 shows an essential part of a memory device to which the address transition detector circuit according to the present invention may be applied. FIG. 7 shows an essential part of a memory cell array of an erasable programmable read only memory (EPROM), and BL1 and BL2 denote bit lines, WL denotes a word line, and MC1 and MC2 denote memory cells. The memory cells MC1 and MC2 which are respectively connected to the bit lines BL1 and BL2 store one bit of information. For example, a data "1" is written into the memory cell MC1 and a data "0" is written into the memory cell MC2. When selecting the bit line, both the bit lines BL1 and BL2 are selected and a high-level signal is applied to the word line WL in this case. No current flows in the bit line when the data is written into the memory cell which is connected to this bit line. Hence, in this case, a current flows in the bit line BL2 because the data "1" is written in the memory cell MC1 which is connected to the bit line BL1. The potential falls at the bit line BL2 in which the current flows. The written information can be read at a high-speed by detecting whether the potential falls at the bit line BL1 or BL2.

An n-channel MOS FET N100 is connected across the bit lines BL1 and BL2, and is turned ON/OFF responsive to a transition detection signal which is applied to a terminal 200. When an address transition occurs, the MOS FET N100 is immediately turned ON responsive to the transition detection signal and short-circuits the bit lines BL1 and BL2. Thus, the potentials at the bit lines BL1 and BL2 are both set to a predetermined level, and the MOS FET N100 then turns OFF. When starting the read operation after the address transition, the potential of the bit line can be raised more quickly from the predetermined level, thereby making it possible to quickly detect the potential fall in one of the bit lines BL1 and BL2.

The present invention may also be applied to an output circuit of a memory device. For example, the output circuit (not shown) may be coupled to an output side of a sense amplifier (not shown) which is coupled to an output side of the variable load circuit 115 shown in FIG. 6. The output circuit is a 3-state circuit having a high-level output mode, a low-level output mode and an inhibit output mode. FIG. 8A shows transitions of an output signal of the output circuit from a high level to a low level and vice versa when the transition detection signal is not used to control the output circuit. In FIGS. 8A and 8B, T1 denotes a time when the transition of the output signal of the output circuit starts, and T2 denotes a time of an address transition. On the other hand, FIG. 8B shows transitions of an output signal of the output circuit from the high level to the low level and vice versa when the output circuit controlled to the inhibit output mode responsive to a transition detection signal when the address transition occurs. In this latter case shown in FIG. 8B, the output signal of the output circuit rises to the high level from an intermediate level between the high and low levels, or falls to the low level from the intermediate level. As a result, the ringing (noise) shown in FIG. 8A is eliminated in FIG. 8B, and in addition, the output signal of the output circuit stabilizes to the high or low level within a short time compared to that shown in FIG. 8A.

Further, the present invention is not limited to these embodiments, but various variations and modifications may be made without departing from the scope of the present invention.

What is claimed is:

1. An address transition detector circuit for detecting a transition of an address signal and for outputting a transition detection signal, said address transition detector circuit comprising:
   a first gate circuit having first and second input terminals coupled for receiving a first address signal at the first input terminal;
   a second gate circuit having third and fourth input terminals coupled for receiving a second address signal at the third input terminal, said first and second address signals being derived from the same address signal but having mutually different phases;
   a first load coupled for feeding back an output signal of said first gate circuit to the fourth input terminal;
   a second load coupled for feeding back an output signal of said second gate circuit to the second input terminal;
   a third gate circuit supplied with the output signals of said first and second gate circuits, said third gate circuit comprising first and second field effect transistors which are connected in series between first and second nodes, said output signal of said first gate circuit being supplied to a gate of said first field effect transistor and said output signal of said second gate circuit being supplied to a gate of said second field effect transistor so that said first and second field effect transistors are simultaneously turned ON for a predetermined time when said first and second address signals undergo a transition;
   first and second power sources respectively for generating first and second power source voltages; and
   means coupled to said first and second nodes and to said first and second power sources for pulling a potential at said first node towards the second power source voltage to a first logic level when both said first and second field effect transistors are turned ON and for pulling the potential at said first node towards the first power source voltage to a second logic level when one of said first and second field effect transistors thereafter turn OFF,
   said means including a bipolar transistor for pulling the potential at said first node towards the second power source voltage when said bipolar transistor is ON and a third load for discharging a base charge of said bipolar transistor towards the second power source voltage when said bipolar transistor is OFF,
   a transition detection signal indicative of the transition of said first and second address signals being obtained from said bipolar transistor.

2. The address transition detector circuit as claimed in claim 1 wherein said means further comprises a fourth load which is coupled between said first node and said first power source, said bipolar transistor being an npn type bipolar transistor having a base connected to said second node, a collector connected to said first node and an emitter coupled to said second power source, said transition detection signal being obtained from said first node.

3. The address transition detector circuit as claimed in claim 2 wherein said third and fourth loads are resistors.

4. The address transition detector circuit as claimed in claim 2 wherein said second power source voltage is a ground potential.

5. An address transition detector circuit for detecting a transition of an address signal and for outputting a transition detection signal, said address transition detector circuit comprising:
   a first gate circuit having first and second input terminals coupled for receiving a first address signal at the first input terminal;
   a second gate circuit having third and fourth input terminals coupled for receiving a second address signal at the third input terminal, said first and second address signals being derived from the same address signal but having mutually different phases;
   a first load coupled for feeding back an output signal of said first gate circuit to the fourth input terminal;
   a second load coupled for feeding back an output signal of said second gate circuit to the second input terminal;
   a third gate circuit supplied with the output signals of said first and second gate circuits, said third gate circuit comprising first and second field effect transistors which are connected in series between first and second nodes, said output signal of said first gate circuit being supplied to a gate of said first field effect transistor and said output signal of said second gate circuit being supplied to a gate of said second field effect transistor so that said first and second field effect transistors are simultaneously turned ON for a predetermined time when said first and second address signals undergo a transition;
   first and second power sources respectively for generating first and second power source voltages; and
   means coupled to said first and second nodes and to said first and second power sources for pulling a potential at said first node towards the second power source voltage to a first logic level when both said first and second field effect transistors are turned ON and for pulling the potential at said first node towards the first power source voltage to a second logic level when one of said first and second field effect transistors thereafter turn OFF,
   said means including a bipolar transistor for pulling the potential at said first node towards the second power source voltage when said bipolar transistor is ON and a third load for discharging a base charge of said bipolar transistor towards the first power source voltage when said bipolar transistor is OFF,
   a transition detection signal indicative of the transition of said first and second address signals being obtained from said bipolar transistor.

6. The address transition detector circuit as claimed in claim 5 wherein said means further comprises a fourth load, said bipolar transistor being a pnp type bipolar transistor having a base connected to said first node, a collector coupled to said second power source and an emitter which is coupled to said first power source through said fourth load, said transition detection signal being obtained from a node which connects said fourth load and the emitter of said bipolar transistor.

7. The address transition detector circuit as claimed in claim 6 wherein said third and fourth loads are resistors.

8. The address transition detector circuit as claimed in claim 6 wherein said second power source voltage is a ground potential.

9. The address transition detector circuit as claimed in claim 1 which further comprises an inverter for inverting the transition detection signal which is output from said means.

10. An address transition detector circuit for detecting a transition of an address signal and for outputting a transition detection signal, said address transition detector circuit comprising:

a plural of detection circuits each supplied with two address signal bits which are both derived from the same bit of the address signal but have mutually different phases;

first and second power sources respectively for generating first and second power source voltages;

a first node which connects outputs of said detection circuits; and a first load which is connected between said first power source and said first node, an arbitrary one of said detection circuits comprising a first gate circuit having first and second input terminals, coupled for receiving a first address signal bit at the first input terminal, a second gate circuit having third and fourth input terminals, coupled for receiving a second address signal bit at the third input terminal, said first and second address signal bits being derived from the same address signal bit but having mutually different phases, a second load for feeding back an output signal of said first gate circuit to the fourth input terminal, a third load for feeding back an output signal of said second gate circuit to the second input terminal, a third gate circuit supplied with the output signals of said first and second gate circuits, said third gate circuit comprising first and second field effect transistors which are connected in series between second and third nodes, said output signal of said first gate circuit being supplied to a gate of said first field effect transistor and said output signal of said second gate circuit being supplied to a gate of said second field effect transistor so that said first and second field effect transistors are simultaneously turned ON for a predetermined time when said first and second address signals undergo a transition, and means coupled to said first and second nodes and to said first and second power sources for pulling a potential at said second node towards the second power source voltage to a first logic level when both said first and second field effect transistors are turned ON and for pulling the potential at said second node towards the first power source voltage to a second logic level when one of said first and second field effect transistors thereafter turn OFF, said means including a bipolar transistor for pulling the potential at said second node towards the second power source voltage when said bipolar transistor is ON and a fourth load for discharging a base charge of said bipolar transistor towards the second power source voltage when said bipolar transistor is OFF, a detection signal indicative of a transition in the first and second address signal bits being obtained from said bipolar transistor and supplied to said first node, a transition detection signal indicative of a transition in at least one of the address signal bits being obtained from said first node.

11. The address transition detector circuit as claimed in claim 10 wherein said bipolar transistor is an npn type bipolar transistor having a base connected to said third node, a collector connected to said second node and an emitter coupled to said second power source, said transition detection signal being obtained from said second node.

12. The address transition detector circuit as claimed in claim 11 wherein said first and fourth loads are resistors.

13. The address transition detector circuit as claimed in claim 11 wherein said second power source voltage is a ground potential.

14. An address transition detector circuit for detecting a transition of an address signal and for outputting a transition detection signal, said address transition detector circuit comprising:

a plurality of detection circuits each supplied with two address signal bits which are both derived from the same bit of the address signal but have mutually different phases;

first and second power sources respectively for generating first and second power source voltages;

a first node which connects outputs of said detection circuits; and a first load which is connected between said first power source and said first node, an arbitrary one of said detection circuits comprising a first gate circuit having first and second input terminals, coupled, for receiving a first address signal bit at the first input terminal, a second gate circuit having third and fourth input terminals, coupled, for receiving a second address signal bit at the third input terminal, said first and second address signal bits being derived from the same address signal bit but having mutually different phases, a second load for feeding back an output signal of said first gate circuit to the fourth input terminal, a third load for feeding back an output signal of said second gate circuit to the second input terminal, a third gate circuit supplied with the output signals of said first and second gate circuits, said third gate circuit comprising first and second field effect transistors which are connected in series between second and third nodes, said output signal of said first gate circuit being supplied to a gate of said first field effect transistor and said output signal of said second gate circuit being supplied to a gate of said second field effect transistor so that said first and second field effect transistors are simultaneously turned ON for a predetermined time when said first and second address signals undergo a transition, and means coupled to said first and second nodes and to said first and second power sources for pulling a potential at said second node towards the second power source voltage to a first logic level when both said first and second field effect transistors are turned ON and for pulling the potential at said second node towards the first power source voltage to a second logic level when one of said first and second field effect transistors thereafter turn OFF, said means including a bipolar transistor for pulling the potential at said second node towards the second power source voltage when said bipolar transistor is ON and a fourth load for discharging a base charge of said bipolar transistor towards the first power source voltage when said bipolar transistor is OFF, a detection signal indicative of a transition in the first and second address signal bits being obtained from said bipolar transistor and supplied to said first node, a transition detection signal indicative of a transition in at least one of the address signal bits being obtained from said first node.

15. The address transition detector circuit as claimed in claim 14 wherein said bipolar transistor is a pnp type bipolar transistor having a base connected to said second node, a collector coupled to said second power source and an emitter which is coupled to said first power source through said first load, said detection signal being obtained from a node which connects said fourth load and the emitter of said bipolar transistor.

16. The address transition detector circuit as claimed in claim 15 wherein said first and fourth loads are resistors.

17. The address transition detector circuit as claimed in claim 15 wherein said second power source voltage is a ground potential.

18. The address transition detector circuit as claimed in claim 10 which further comprises an inverter for inverting the transition detection signal which is output from said first node.

* * * * *

UNITED STATES PATENT AND TRADEMARK OFFICE
CERTIFICATE OF CORRECTION

PATENT NO. : 4,982,117
DATED : January 1, 1991
INVENTOR(S) : MATSUZAKI et al.

It is certified that error appears in the above-identified patent and that said Letters Patent is hereby corrected as shown below:

Col. 1, line 22, change "$\overline{AO}$" to --$\overline{\overline{AO}}$--, and "An" to --$\overline{An}$--;

line 24, change "AO" to --$\overline{\overline{AO}}$--;

line 25, change "An" to --$\overline{An}$-- (both occurrences), and change "AO" to --$\overline{\overline{AO}}$--;

line 27, change "AO" to --$\overline{\overline{AO}}$--;

line 28, change "An" to --$\overline{An}$--;

line 29, change "Äi" (first occurrence) to --$\overline{\overline{Ai}}$--, and change "Ai" (second occurence) to --$\overline{\overline{Ai}}$--;

line 39, change "$\overline{AO}$" to --$\overline{\overline{AO}}$--;

line 40, change "AO" to --$\overline{\overline{AO}}$--;

line 48, change "$\overline{AO}$" to --$\overline{\overline{AO}}$--;

line 49, change "AO" to --$\overline{\overline{AO}}$--;

line 51, change "$\overline{AO}$" to --$\overline{\overline{AO}}$--;

line 57, change "AO" to --$\overline{\overline{AO}}$--.

Col. 2, line 23, change "$\overline{AO}$" to --$\overline{\overline{AO}}$--;

line 24, change "AO" to --$\overline{\overline{AO}}$--;

line 27, change "AO" to --$\overline{\overline{AO}}$--, and change "$\overline{AO}$" to --$\overline{\overline{AO}}$--;

line 28, change "AO" to --$\overline{\overline{AO}}$--;

line 31, change "AO" to --$\overline{\overline{AO}}$--.

UNITED STATES PATENT AND TRADEMARK OFFICE
CERTIFICATE OF CORRECTION

PATENT NO. : 4,982,117
DATED : January 1, 1991
INVENTOR(S) : MATSUZAKI et al.

It is certified that error appears in the above-identified patent and that said Letters Patent is hereby corrected as shown below:

Col. 4, line 50, change "time" to --timing--.

Col. 5, line 2, after "A" insert --,--;
      line 4, change "A" to --$\overline{\overline{A}}$--;
      line 5, change "A" (second occurrence) to --$\overline{\overline{A}}$--;
      line 8, change "A" to --$\overline{A}$--;
  line 28, change "is" to --are--;
  line 29, change "both" to --respective--;
      line 41, after "inverted" insert --with respect--;
      line 47, change "a" to --the portion of the--, and change "part which is made up of" to --comprising--;
      line 54, change "A" to --$\overline{A}$--.

Col. 6, line 24, change "Ai" (second occurrence) to --$\overline{Ai}$--;
      line 25, change "Ai" to --$\overline{Ai}$--;
      line 26, change "Ai" to --$\overline{\overline{Ai}}$--.

Col. 7, line 2, change "time" to --timing--;
      line 6, change "AO" to --$\overline{\overline{AO}}$--;
      line 13, change "AO" to --$\overline{\overline{AO}}$--;
      line 33, change "AO" to --$\overline{\overline{AO}}$--.

UNITED STATES PATENT AND TRADEMARK OFFICE
CERTIFICATE OF CORRECTION

PATENT NO. : 4,982,117
DATED : January 1, 1991
INVENTOR(S) : MATSUZAKI et al.

It is certified that error appears in the above-identified patent and that said Letters Patent is hereby corrected as shown below:

```
Col. 11, line 50, after "voltage" insert --and thereby--;
         line 53, after "voltage" insert --and thereby--.

Col. 12, line 48, after "voltage" insert --and thereby--;
         line 51, after "voltage" insert --and thereby--.

Col. 13, line 58, after "voltage" insert --and thereby--;
         line 62, after "voltage" insert --and thereby--.

Col. 15, line 1, after "voltage" insert --and thereby--.
```

Col. 16, line 6, change "fourth" to --first--.

Signed and Sealed this

Thirteenth Day of July, 1993

Attest:

MICHAEL K. KIRK

*Attesting Officer*     *Acting Commissioner of Patents and Trademarks*